US012811026B2

(12) United States Patent
Koike et al.

(10) Patent No.: US 12,811,026 B2
(45) Date of Patent: Nov. 24, 2026

(54) COPPER OXIDE PASTE AND METHOD FOR PRODUCING ELECTRONIC PARTS

(71) Applicant: Material Concept, Inc., Sendai (JP)

(72) Inventors: Junichi Koike, Sendai (JP); Tri Hai Hoang, Sendai (JP)

(73) Assignee: MATERIAL CONCEPT, INC., Sendai (JP)

( * ) Notice: Subject to any disclaimer, the term of this patent is extended or adjusted under 35 U.S.C. 154(b) by 741 days.

(21) Appl. No.: 17/764,404

(22) PCT Filed: Sep. 25, 2020

(86) PCT No.: PCT/JP2020/036384
§ 371 (c)(1),
(2) Date: Mar. 28, 2022

(87) PCT Pub. No.: WO2021/060503
PCT Pub. Date: Apr. 1, 2021

(65) Prior Publication Data

US 2022/0332958 A1 Oct. 20, 2022

(30) Foreign Application Priority Data

Sep. 27, 2019 (JP) ................................ 2019-177926

(51) Int. Cl.
*H01B 1/22* (2006.01)
*B22F 1/052* (2022.01)
*B23K 35/02* (2006.01)
*H05K 1/09* (2006.01)
*H05K 3/12* (2006.01)

(52) U.S. Cl.
CPC ............... *H01B 1/22* (2013.01); *B22F 1/052* (2022.01); *B23K 35/025* (2013.01); *H05K 1/092* (2013.01); *H05K 3/12* (2013.01); *B22F 2301/10* (2013.01); *H05K 2203/1131* (2013.01)

(58) Field of Classification Search
None
See application file for complete search history.

(56) References Cited

U.S. PATENT DOCUMENTS 2,837,487 A * 6/1958 Huttar .............. H01C 17/06553 252/514
4,322,316 A * 3/1982 Provance ............... H10D 86/85 427/126.3
4,511,601 A * 4/1985 Akse ................... C04B 41/5127 427/98.5
4,868,034 A * 9/1989 Steinberg ................. H01B 1/16 428/209
4,877,555 A * 10/1989 Yuhaku ................ H01G 4/0085 106/1.23
2007/0209475 A1* 9/2007 Sakaue .................... H01B 1/22 75/255
2009/0288709 A1* 11/2009 Iida ................. H01L 31/022425 136/265
2017/0135221 A1 5/2017 Koike et al.
2019/0355690 A1 11/2019 Nakako et al.

FOREIGN PATENT DOCUMENTS

JP 02033806 A * 2/1990
JP 06302927 A * 10/1994
JP 2004247572 A 9/2004
JP 2004307881 A * 11/2004
JP 2006093003 A * 4/2006
JP 2009253196 A * 10/2009
JP 2010059001 A * 3/2010
JP 4782397 B2 7/2011
JP 2013107799 A 6/2013
JP 2013109966 A 6/2013
JP 2016126877 A 7/2016
JP 2017069201 A 4/2017
JP 6529632 B1 6/2019
RU 2337799 C2 * 11/2008
WO 2015194366 A1 12/2015
WO 2016136409 A1 9/2016
WO 2018131095 A1 7/2018

OTHER PUBLICATIONS

International Search Report for International Application No. PCT/JP2020/036384; Date of Mailing, Dec. 8, 2020.
Particle Size Distribution (PSD) PowderProcess.net, Engineering resources for power processing industries; 4 pages. Downloaded May 2025. Retrieved from https://www.powderprocess.net/psd.html.

* cited by examiner

*Primary Examiner* — Stephani Hill
(74) *Attorney, Agent, or Firm* — CANTOR COLBURN LLP

(57) ABSTRACT

Provided is a copper-based paste capable of bonding a chip component and a substrate more firmly and obtaining a copper-based bonding material having high thermal conductivity. This copper oxide paste includes copper-containing particles, a binder resin, and an organic solvent. The copper-containing particles contain $Cu_2O$ and CuO. The total amount of copper element constituting $Cu_2O$ and copper element constituting CuO is 90% or more of the copper element contained in the copper-containing particles. The copper-containing particles have a 50% cumulative particle size ($D_{50}$) of 0.20-5.0 μm inclusive; the 50% cumulative particle size ($D_{50}$) and the 10% cumulative particle size ($D_{10}$) satisfy $1.3 \leq D_{50}/D_{10} \leq 4.9$; the 50% cumulative particle size ($D_{50}$) and the 90% cumulative particle size ($D_{90}$) satisfy $1.2 \leq D_{90}/D_{50} \leq 3.7$, and the BET specific surface area of the copper-containing particles is 1.0 $m^2/g$ to 8.0 $m^2/g$ inclusive.

6 Claims, No Drawings

COPPER OXIDE PASTE AND METHOD FOR PRODUCING ELECTRONIC PARTS

CROSS REFERENCE TO RELATED APPLICATIONS

This is the U.S. national stage of application No. PCT/JP2020/036384, filed on Sep. 25, 2020. Priority under 35 U.S.C. § 119 (a) and 35 U.S.C. § 365 (b) is claimed from Japanese Application No 2019-177926, filed Sep. 27, 2019, the disclosure of which is also incorporated herein by reference.

TECHNICAL FIELD

The present invention relates to a copper oxide paste and a method for producing an electronic part. Specifically, the present invention relates to a copper oxide paste suitable for bonding a chip component to a substrate, and a method for producing electronic parts by using the copper oxide paste.

BACKGROUND ART

Chip components used for electronic parts generate heat during operation. For example, chip components such as power devices and laser diodes have large operating power, thereby generating a large amount of heat during the operation. Such generated heat can adversely affect the operation of the chip components. Thus, a structure has been adopted that allows the chip component to be bonded to a substrate having heat dissipation property, thereby allowing thermal conduction from the chip component to the substrate and heat dissipation from the substrate to environment. A solder alloy is often used as a bonding material upon bonding, and in a bonding step, an alloy paste having solder alloy powder mixed with a binder is utilized. However, the solder alloy such as a Sn alloy has lower thermal conductivity than a copper-based material constituting electrodes or a substrate, which precludes heat generated in chip components from conducting to the substrate sufficiently.

Regarding to a solder alloy paste, which will be applied to bonding of power devices, etc., for example, Patent Document 1 proposes a solder alloy containing 0.03% by mass to 0.09% by mass of nickel and bismuth in the balance and discloses an alloy paste containing the solder alloy powder and an alloy material obtained from the alloy paste having a high melting point and excellent ductility.

Patent Document 1: Japanese Patent No. 6529632

DISCLOSURE OF THE INVENTION

Problems to be Solved by the Invention

However, the solder alloy material as in Patent Document 1 is likely to raise a manufacturing cost due to expensive nickel or bismuth used as a raw material.

Incidentally, Copper (Cu) is exemplified, which is an inexpensive metal material and can be used as a bonding material between a chip component and a substrate. However, bonding by using a copper-based paste containing conventional copper powder does not exhibit sufficient adhesion between the chip component and the substrate. Thus, there is room for further improvement in order to make heat of the chip component to transfer to the substrate efficiently and to firmly bond the chip component and the substrate.

The present invention has been made in view of the aforementioned circumstances. An object of the present invention is to provide a copper-based paste capable of bonding a chip component and a substrate more firmly and providing a copper-based bonding material having high thermal conductivity.

Means for Solving the Problems

For a copper oxide paste containing copper-containing particles, a binder resin, and an organic solvent, the present inventors have focused on a content of copper element constituting $Cu_2O$ and CuO contained in the copper-containing particles and particle size distributions relating to a 10% cumulative particle size ($D_{10}$), a 50% cumulative particle size ($D_{50}$), and a 90% cumulative particle size ($D_{90}$), and a BET specific surface area. The present inventors have found that the copper oxide paste defined in these features provides a copper-based bonding material that firmly bonds a chip component and a substrate in an electronic part and has high thermal conductivity, and thus have completed the present invention. Specifically, the present invention includes the following aspects (1) to (8). Incidentally, as used herein, the expression "to" between numerical values includes the indicated numerical values. Namely, "X to Y" is synonymous with "X or more and Y or less".

(1) The first aspect is a copper oxide paste, including copper-containing particles, a binder resin, and an organic solvent, wherein the copper-containing particles contain $Cu_2O$ and CuO; the total amount of copper constituting $Cu_2O$ and CuO in the copper-containing particles is 90% or more of the total copper amount of the copper-containing particles; the copper-containing particles have a 50% cumulative particle size ($D_{50}$) of 0.20 μm or more and 5.0 μm or less, have a 10% cumulative particle size ($D_{10}$) satisfying the following formula (1) together with the 50% cumulative particle size ($D_{50}$), and have a 90% cumulative particle size ($D_{90}$) satisfying the following formula (2) together with the 50% cumulative particle size ($D_{50}$); and the copper-containing particles have a BET specific surface area of 1.0 $m^2/g$ or more and 8.0 $m^2/g$ or less:

$$1.3 \leq D_{50}/D_{10} \leq 4.9 \quad (1)$$

$$1.2 \leq D_{90}/D_{50} \leq 3.7 \quad (2).$$

(2) The second aspect is the copper oxide paste according to (1) above, wherein the copper-containing particles have a molar ratio of $Cu_2O$ to CuO of 1.0 or more.

(3) The third aspect is the copper oxide paste according to (1) or (2) above, having a content of the copper-containing particles of 60% or more and 92% or less of the paste, and having a viscosity of 50 Pa·s or more and 2500 Pa·s or less at a shear rate of 1 $sec^{-1}$.

(4) The fourth aspect is a method for producing an electronic part, comprising: a step of applying the copper oxide paste according to any one of (1) to (3) above on a surface of a substrate by coating or printing; and a step of subjecting the substrate to a heat treatment at a temperature of 200° C. or higher and 600° C. or lower in a reducing gas atmosphere to obtain a copper sintered body on the substrate.

(5) The fifth aspect is the method for producing an electronic part according to (4) above, wherein the substrate is a metal substrate, an organic polymer substrate, a ceramics substrate, or a carbon substrate.

(6) The sixth aspect is the method for producing an electronic part according to (4) or (5) above, wherein the reducing gas atmosphere contains one or more gases selected from the group consisting of hydrogen, formic acid and an alcohol.

(7) The seventh aspect is the method for producing an electronic part in any one of (4) to (6) above, wherein the copper sintered body has an electrical resistivity of 2.5 μΩcm or more and 12 μΩcm or less.

(8) The eighth aspect is the method for producing the electronic parts in any one of (4) to (7) above, further comprising, before the heat treatment, a step of placing a chip component on a surface of the dried copper oxide paste and applying a pressure of 2 MPa or more and 30 MPa or less in a direction from the surface of the chip component to the substrate.

Effects of the Invention

According to the present invention, it is possible to provide a copper-based paste capable of bonding a chip component and a substrate more firmly in electronic parts and providing a copper-based bonding material having high thermal conductivity.

PREFERRED MODE FOR CARRYING OUT THE INVENTION

Hereinafter, specific embodiments of the present invention will be described in detail. The present invention is not limited to the following embodiments and can be implemented with appropriate modifications within the scope of the gist of the present invention.

1. Copper Oxide Paste

The copper oxide paste according to the present embodiment contains copper-containing particles, a binder resin, and an organic solvent. The copper-containing particles contain $Cu_2O$ and CuO, and a total amount of copper element constituting $Cu_2O$ and copper element constituting CuO, of copper element contained in the copper-containing particles, is 90% or more. Moreover, the copper-containing particles have a 50% cumulative particle size ($D_{50}$) of 0.20 μm or more and 5.0 μm or less, and the 50% cumulative particle size ($D_{50}$) and a 10% cumulative particle size ($D_{10}$) satisfy formula (1) shown below, and the 50% cumulative particle size ($D_{50}$) and a 90% cumulative particle size ($D_{90}$) satisfy formula (2) shown below. Further, a BET specific surface area of the copper-containing particles is 1.0 $m^2/g$ or more and 8.0 $m^2/g$ or less.

$$1.3 \leq D_{50}/D_{10} \leq 4.9 \quad (1)$$

$$1.2 \leq D_{90}/D_{50} \leq 3.7 \quad (2)$$

When the copper oxide paste is heated in a reducing atmosphere, both $Cu_2O$ and CuO in the copper-containing particles contained in the copper oxide paste are reduced to become metallic copper, and the copper-containing particles are sintered with each other to make a copper sintered body. For example, when the copper oxide paste is used to bond a chip component to a substrate, the chip component and the substrate can be firmly bonded to each other.

Generally, a copper-based paste containing metallic copper particles as a main component is used in order to make a copper sintered body. The copper-based paste of this type is mostly sintered in an inert gas atmosphere in order to avoid the oxidation of the metallic copper particles. In contrast, the copper oxide paste according to the present invention contains copper-based particles containing copper oxide composed of $Cu_2O$ and CuO as a main component. Accordingly, it is possible to obtain a copper sintered body through a sintering reaction proceeding between copper-based particles with the copper oxide being reduced to metallic copper by heating in a reducing atmosphere.

The copper oxide paste according to the present invention can be easily sintered as compared with a copper-based paste containing metallic copper particles as a main component. The reason is conjectured as follows. In general, sintering of adjacent particles is achieved through the diffusion of the atoms constituting the particles. It can be said that the higher the diffusion coefficient of the atoms, the easier the sintering. Here, a diffusion coefficient (D) of an atom can be represented by the formula: "$D=C_vD_v+C_iD_i$", which is obtained by multiplying each of a concentration of atomic vacancies ($C_v$) and a concentration of interstitial atoms ($C_i$), which are diffusion carriers, by a diffusion coefficient of atomic vacancies ($D_v$) and a diffusion coefficient of interstitial atoms ($D_i$) respectively, and further summing the products. In general, the value of $C_vD_v$ is much larger than the value of $C_iD_i$, and therefore, the above formula of diffusion coefficient D can be approximately expressed as $D=C_vD_v$.

In a case where a copper-based paste containing metallic copper particles is sintered in a nitrogen gas atmosphere, the concentration of atomic vacancies $C_v$ corresponds to a concentration in an equilibrium state. When $Cu_2O$ and CuO, on the other hand, are reduced, the oxygen ions are removed from $Cu_2O$ and CuO. The concentration of atomic vacancies $C_v$ becomes larger than the concentration in the equilibrium state, which is about two orders of magnitude higher than the concentration of atomic vacancies in the case of metallic copper particles. Therefore, as compared with the copper-based paste containing metallic copper particles, the sintering with the copper-based paste containing copper oxide rapidly proceeds even at a lowered temperature, which enables the sintering very efficiently.

Therefore, by using the copper oxide paste according to the present invention as, for example, a bonding material for bonding a chip component to a substrate, a copper sintered body obtained by sintering the copper oxide paste containing $Cu_2O$ and CuO in a reducing atmosphere, can bond the chip component and the substrate very firmly. In the present specification, an example of a form for use as a bonding material between a chip component and a substrate may be described below. This specification is an example of the usage embodiment according to the present invention, and the copper oxide paste according to the present invention is not limited to this usage embodiment.

Generally, a $Cu_2O$ particle has a shape such as a cube or an octahedron, and a CuO particle has a fibrous or thin platy shape. The copper oxide paste according to the present invention contains copper-containing particles containing both $Cu_2O$ and CuO. Accordingly, in a sintering process under a reducing atmosphere, fibrous or thin plate-shaped CuO particles fill the gaps between $Cu_2O$ particles having cubic or octahedral shapes or the like, and are reduced and sintered. The above allows the density of copper atoms to be increased. As a result, the copper sintered body formed from the copper oxide paste has high thermal conductivity as well as an extremely high bonding strength between a chip component and a substrate.

[Copper-Containing Particles]

As described above, the copper-containing particle is one component contained in the copper oxide paste according to the present invention and is sintered in a reducing atmosphere to change into a copper sintered body. The copper sintered body bonds the chip component and the substrate firmly and are responsible for thermal conduction between the two. The total amount of copper element constituting $Cu_2O$ and CuO in the copper-containing particles is preferably 90% or more, more preferably 95% or more, 97% or more, or 98% or more by atomic % of the total copper amount of the copper-containing particles in order to secure sufficient thermal conductivity and the bonding strength in the copper sintered body.

The copper element contained in the copper-containing particles may be contained as a metallic copper or other copper compound in addition to the copper element constituting $Cu_2O$ and the copper element constituting CuO. The other copper compound is preferably one that changes to metallic copper in a reducing gas atmosphere. Even if elements other than copper (for example, Co, Ag, Sn, Ni, Sb) are contained in the copper-containing particles, they are heated in a reducing gas atmosphere, thereby do not change to oxides, and further the amount thereof is small. The total amount of the copper element constituting $Cu_2O$ and the copper element constituting CuO of 90% or more can ensure sufficient thermal conductivity and bonding strength, which allows elements other than copper to be contained.

[Molar ratio of $Cu_2O$ to CuO]

The amount of $Cu_2O$ contained in the copper-containing particles in terms of molar ratio ($Cu_2O$/CuO) of an amount of $Cu_2O$ to an amount of CuO contained in the copper-containing particles is preferably 1.0 or more and more preferably 2.0 or more. When the molar ratio is less than 1.0, an amount of fibrous or thin platy CuO particles becomes excessive, so that the density of the obtained copper sintered body becomes small, resulting in reduction of the bonding strength and thermal conductivity.

Meanwhile, the molar ratio relative to an amount of CuO is preferably 100 or less, more preferably 50 or less or 40 or less. When the molar ratio exceeds 100, the amount of CuO particles, which are disposed in the gaps between the $Cu_2O$ particles and promoting sintering of the $Cu_2O$ particles, becomes too small, so that the density of the obtained copper sintered body becomes small, resulting in deterioration of the bonding strength and thermal conductivity.

$Cu_2O$ and CuO contained in the copper-containing particles may be present as discrete particles or may be present as particles in which both $Cu_2O$ and CuO are present in one particle. Moreover, two or more types selected from the group consisting of particles containing $Cu_2O$ and not containing CuO, particles containing CuO and not containing $Cu_2O$, and particles containing both $Cu_2O$ and CuO may be present in admixture.

[Content of Copper-Containing Particles]

The content of copper-containing particles is not particularly limited. The content of copper-containing particles in the copper oxide paste affects a vehicle concentration in the paste and is therefore a factor closely associated with a viscosity of the paste. With a content of the copper-containing particles in the copper oxide paste of 60% by mass or more and 92% by mass or less with respect to the total amount of the copper oxide paste, a viscosity of the copper oxide paste at a shear rate of 1 $sec^{-1}$ of 50 Pa·s or more and 2500 P·as or less can be achieved. With a content of the copper-containing particles of less than 60% by mass, the viscosity is lowered to less than 50 Pa·s. Accordingly, the paste is likely to spread out thinly when applied on a substrate. Thus, the copper sintered body after sintering is not formed with a sufficient thickness, leading to a decrease in the bonding strength and thermal conductivity. Meanwhile, with a content of the copper-containing particles in the copper oxide paste exceeding 92% by mass, the viscosity of the paste increases to more than 2500 Pa·s, and the paste with which the substrate is coated is difficult to provide a flat surface. Consequently, when a chip component is mounted on the substrate, the paste cannot spread out over the entire mounting surface of the chip component, reducing a contact area with the substrate, and leading to lowering of the bonding strength and thermal conductivity.

As described above, in order to secure a high bonding strength and high thermal conductivity, the content of the copper-containing particles in the copper oxide paste is preferably 60% or more and 92% or less with respect to the total amount of the copper oxide paste. A lower limit of the content is more preferably 65% by mass or more, or 70% by mass or more. An upper limit of the content is, on the other hand, more preferably 90% by mass or less, or 85% by mass or less.

[Particle Size of Copper-Containing Particle]

A 50% cumulative particle size ($D_{50}$) of the copper-containing particles is preferably 0.20 μm or more and 5.0 μm or less. A small particle size of the copper-containing particles promotes sintering of the particles with each other. The 50% cumulative particle size ($D_{50}$) of copper-containing particles being 5.0 μm or less enables low-temperature sintering, resulting in high thermal conductivity imparted to the sintered body obtained without causing damage to the chip components due to high-temperature sintering. When the 50% cumulative particle size ($D_{50}$) is more than 5.0 μm, voids are frequently formed in the sintered structure. Accordingly, cracks are formed in the copper sintered body, leading to a reduced bonding strength and a lowered thermal conductivity of the copper sintered body obtained. Therefore, the 50% cumulative particle size ($D_{50}$) is preferably 5.0 μm or less and more preferably 4.9 μm or less, or 2.9 μm or less.

If the particle size of the copper-containing particle is excessively small, on the other hand, sintering may proceed rapidly and cracking may occur in the sintered body. If the 50% cumulative particle size ($D_{50}$) is less than 0.20 μm, volume shrinkage becomes large upon sintering of the copper-containing particles, generating a large shear stress at an interface between a chip component and a substrate, and causing detachment of the chip component from the substrate. The 50% cumulative particle size ($D_{50}$) being 0.20 μm or more can inhibit rapid sintering of copper-containing particles, and prevent the formation of cracks in the copper sintered body formed by the copper-containing particles and the reduction of the bonding strength. Therefore, the 50% cumulative particle size ($D_{50}$) is preferably 0.20 μm or more. Further, it is preferably 0.23 μm or more, or 0.32 μm or more.

It is to be noted that the 50% cumulative particle size ($D_{50}$) of the copper-containing particles and a 90% cumulative particle size ($D_{90}$) and a 10% cumulative particle size ($D_{10}$), as will be described below, refer to values measured by a laser diffraction type particle size distribution meter.

The 50% cumulative particle size ($D_{50}$) and the 10% cumulative particle size ($D_{10}$) of the copper-containing particles preferably satisfy formula (1) shown below. The "$D_{50}/D_{10}$" in formula (1) indicates a ratio of the 50% cumulative particle size ($D_{50}$) to the 10% cumulative particle size ($D_{10}$).

$$1.3 \leq D_{50}/D_{10} \leq 4.9 \quad (1)$$

When the copper-containing particles in the copper oxide paste are sintered, voids between large particles are filled with small particles, so that a copper sintered body in which the copper particles are densely filled can be obtained, and the thermal conductivity and bonding strength of the copper sintered body can be increased. Thus, it is effective to allow the large particles and small particles to be contained in an appropriate degree. From this point of view, the $D_{50}/D_{10}$ is preferably 1.3 or more because a particle size distribution of the copper-containing particles becomes broad and both large particles and small particles are contained in the appropriate degree.

When a content of coarse particles increases due to an excessive amount of large particles in the copper-containing particles, on the other hand, sintering of the coarse particles leads to the formation of large voids, which may cause the formation of cracks in a copper sintered body. Thus, it is effective to reduce the content of coarse particles. From this viewpoint, the $D_{50}/D_{10}$ is preferably 4.9 or less because the content of coarse particles in the copper-containing particles is reduced to suppress the formation of large voids. The above makes it possible to prevent the formation of cracks in the copper sintered body, which thereby can enhance the thermal conductivity of the copper sintered body and the bonding strength between a chip component and a substrate.

The value of $D_{50}/D_{10}$ is not particularly limited as long as the relationship: $1.3 \le D_{50}/D_{10} \le 4.9$ is satisfied. As to the upper limit value, $D_{50}/D_{10}$ is more preferably 4.5 or less, 4.0 or less, or 3.5 or less. As to the lower limit value, $D_{50}/D_{10}$ is more preferably 2.8 or more, 2.9 or more, or 3.0 or more.

The 50% cumulative particle size ($D_{50}$) and the 90% cumulative particle size ($D_{90}$) of the copper-containing particles preferably satisfy formula (2) shown below. The "$D_{90}/D_{50}$" in formula (2) indicates a ratio of the 90% cumulative particle size ($D_{90}$) to the 50% cumulative particle size ($D_{50}$).

$$1.2 \le D_{90}/D_{50} \le 3.7 \tag{2}$$

When $D_{90}/D_{50}$ is 1.2 or more, a particle size distribution of the copper-containing particles broadens, and both large particles and small particles are contained in an appropriate degree. Thus, filling gaps between large particles with small particles makes it possible to obtain a copper sintered body in which copper particles are densely filled, and to enhance the thermal conductivity and bonding strength of the copper sintered body. From this viewpoint, $D_{90}/D_{50}$ is preferably 1.2 or more.

When $D_{90}/D_{50}$ is 3.7 or less, on the other hand, a content of coarse particles in the copper-containing particles is reduced as well as the generation of large voids by sintering of the coarse particles is suppressed. The above can prevent cracks from forming in the copper sintered body, which enables the thermal conductivity of the copper sintered body and the bonding strength between the chip component and the substrate to be further enhanced. From this viewpoint, $D_{90}/D_{50}$ is preferably 3.7 or less.

The value of $D_{90}/D_{50}$ is not particularly limited as long as the relationship: $1.2 \le D_{90}/D_{50} \le 3.7$ is satisfied. As to the upper limit value, $D_{90}/D_{50}$ is more preferably 3.0 or less, 2.9 or less, or 2.5 or less. As to the lower limit value, $D_{90}/D_{50}$ is more preferably 1.3 or more, 1.5 or more, or 1.7 or more.

[BET Specific Surface Area]

The BET specific surface area of the copper-containing particles is preferably 1.0 $m^2/g$ or more and 8.0 $m^2/g$ or less. The BET specific surface area of the copper-containing particles being 1.0 $m^2/g$ or more allows the copper-containing particles to contact with each other and further allows the surface diffusion of the copper atoms to be promoted, which activates sintering. As a result, high thermal conductivity can be imparted to the obtained copper sintered body without causing damage to chip components due to high temperature sintering. If the BET specific surface area of the copper-containing particles is excessively large, the proportion of unevenness on the surface of the copper-containing particles increases. Therefore, the degree of contact between the copper-containing particles on the entire surface decreases, which may prevent the copper-containing particles from being densely sintered. From this point of view, when the BET specific surface area of the copper-containing particles is 8.0 $m^2/g$ or less, the copper-containing particles are densely sintered, which enables an enhanced thermal conductivity of the obtained copper sintered body and an increased bonding strength between a chip component and a substrate.

The BET specific surface area of the copper-containing particles is not particularly limited as long as it is 1.0 $m^2/g$ or more and 8.0 $m^2/g$ or less. The BET specific surface area is further preferably 1.1 $m^2/g$ or more, or 1.2 $m^2/g$ or more. On the other hand, the BET specific surface area of the copper-containing particles is preferably 8.0 $m^2/g$ or less, more preferably 7.6 $m^2/g$ or less, or 5.7 $m^2/g$ or less.

[Binder Resin]

A binder resin is a component that forms an organic vehicle in the copper oxide paste together with an organic solvent described below. The binder resin is added in order to impart an appropriate viscosity to the copper oxide paste and then to improve printability. The copper oxide paste according to the present embodiment is heated in a reducing gas atmosphere containing no oxygen in a sintering step. However, the binder resin is oxidized by oxygen derived from $Cu_2O$ and CuO in the copper-containing particles thereby to be removed as a gas such as CO and $CO_2$ upon sintering.

The binder resin is not particularly limited as long as it is a resin that will be decomposed by a heating step for sintering. Any resin that is likely to react with oxygen or carbon monoxide and easily removed from the copper oxide paste may be used. Examples include cellulose resins such as methyl cellulose, ethyl cellulose and carboxymethyl cellulose, acrylic resins such as polymethyl methacrylate, and butyral resins such as polyvinyl butyral.

A content of the binder resin is not particularly limited. The content of the binder resin is preferably 0.01% by mass or more, or 0.05% by mass or more, with respect to the copper oxide paste. In addition, the content of the binder resin is preferably 5.0% by mass or less, or 1.0% by mass or less.

In order to increase a viscosity or printability of the copper oxide paste, the content of the binder resin is preferably 0.01% by mass or more, and may be 0.05% by mass or more. On the other hand, from the viewpoint of reducing an amount of a residual resin remaining in wire after sintering and achieving a low electrical resistivity, the content of the binder resin is preferably 5% by mass or less.

[Organic Solvent]

An organic solvent is a component that disperses the copper-containing particles in the copper oxide paste and imparts fluidity and printability to the copper oxide paste.

The organic solvent is not particularly limited as long as it has an appropriate boiling point, vapor pressure and viscosity. Examples include a hydrocarbon-based solvent, a chlorinated hydrocarbon-based solvent, a cyclic ether-based solvent, an amide-based solvent, a sulfoxide-based solvent, a ketone-based solvent, an alcohol-based compound, an ester-based solvent of a polyhydric alcohol, an ether-based solvent of a polyhydric alcohol, and a terpene-based solvent. Among them, a mixture selected from the two or more thereof may be used. Solvents with a boiling point near 200° C., such as texanol (boiling point=244° C.), butyl carbitol (231° C.), butyl carbitol acetate (247° C.), terpineol (219° C.), are preferably used, depending on applications of the copper oxide paste.

A content of the organic solvent is not particularly limited. The organic solvent can be contained in an amount of 5% by mass or more, 7% by mass or more, or 10% by mass or more with respect to the copper oxide paste, depending on the applications of the copper oxide paste. On the other hand, from the viewpoint of an upper limit of the content, the organic solvent may be contained in an amount of 40% by mass or less, 30% by mass or less, or 25% by mass or less with respect to the copper oxide paste.

[Other Ingredients]

The copper oxide paste may contain an arbitrary component in addition to the aforementioned components of the copper-containing particles, the resin binder and the organic solvent. A metal salt and a polyol, which are arbitrary components contained in the conventional conductive paste, can be used in combination. Upon sintering, the polyol reduces the metal salt, and the reduced metal precipitates in voids between the particles to fill the voids. Accordingly, the thermal conductivity of the resultant copper sintered body and the bonding strength between a chip component and a substrate, can be further enhanced.

As the aforementioned metal salt, for example, a copper salt, specifically, one or two or more of copper acetate (II), copper benzoate (II), bis (acetylacetonate) copper (II), etc., can be used.

As the aforementioned polyol, for example, one or two or more of ethylene glycol, diethylene glycol, trimethylene glycol, propylene glycol, and tetraethylene glycol can be used.

The copper oxide paste according to the present embodiment may or may not contain an inorganic component in addition to the copper compounds such as $Cu_2O$ and CuO and metallic copper contained in the copper-containing particles. The inorganic component refers to that containing a metal and/or metalloid other than copper. The inorganic component can be a compound such as a composite oxide in which a metal and/or metalloid other than copper is composited with copper. The inorganic component includes, for example, gold as a metal, silver or platinum, boron as a metalloid, a glass frit as a metal oxide, etc.

From the viewpoint of maintaining characteristics such as a bonding strength, electrical conductivity, and inexpensiveness of the copper sintered body obtained by the copper oxide paste according to the present embodiment, the total amount of inorganic components containing metals and/or metalloids other than copper may be 30% by mass or less, 20% by mass or less, 10% by mass or less, 6% by mass or less, or 1% by mass or less with respect to the inorganic component in the copper oxide paste. An incorporation of unavoidable impurities is also acceptable.

[Viscosity of Copper Oxide Paste]

The viscosity of the copper oxide paste at a shear rate of 1 $sec^{-1}$ is not particularly limited. From the viewpoint of uniform coating of the copper oxide paste on a substrate, the viscosity of the copper oxide paste is preferably 50 Pa·s or more and 2500 Pa·s or less. If the viscosity of the paste is too low, a thickness of the paste applied on the substrate becomes thin, which makes it difficult to obtain a copper sintered body having a sufficient thickness. Therefore, as to the lower limit, the viscosity of the copper oxide paste is preferably 50 Pa·s or more, and may be 100 Pa·s or more, 150 Pa·s or more, 200 Pa·s or more, or 300 Pa·s or more, depending on an embodiment.

Meanwhile, if the viscosity of the paste is excessively high, it is difficult to allow the paste applied on the substrate to have a flat surface, which may result in an uneven thickness in the copper sintered body. Therefore, as to the upper limit, the viscosity of the copper oxide paste is preferably 2,500 Pa·s or less, and may be 1,000 Pa·s or less, 800 Pa·s or less, or 600 Pa·s or less, depending on an embodiment. By coating a substrate uniformly with the copper oxide paste thereon, the thermal conductivity of the obtained copper sintered body and the bonding strength between a chip component and the substrate can be enhanced.

[Analysis of Copper Oxide Paste]

A generally-available copper oxide paste can be analyzed, for example, in a method described below. In order to obtain a weight ratio of the vehicle and a weight ratio of the binder resin and the solvent contained in the vehicle, the paste is heated with a ramp rate of 10° C. per minute with using a thermogravimetric analysis (TGA) apparatus to measure a weight loss. The weight loss in the first stage corresponds to the weight ratio of the solvent to the copper oxide paste. The weight loss in the second stage corresponds to the weight ratio of the binder resin to the copper oxide paste. The amount of the residue corresponds to the weight ratio of the copper-containing particles. The types of the solvent and the binder resin can be identified by obtaining a composition ratio of carbon, hydrogen, nitrogen and sulfur with using a CHNS analyzer, and further by measuring a molecular weight of molecules released from the paste in the first step and the second step upon heating with using a thermogravimetric-mass spectrometry (TGA-MS) apparatus. Information on the copper-containing particles can be obtained by diluting the copper oxide paste with an organic solvent such as isopropyl alcohol, separating the copper-containing particles from the vehicle with using a centrifuge, and analyzing the obtained copper-containing particles by various analysis methods. The ratio of $Cu_2O$ and CuO can be obtained by, for example, analyzing them by an X-ray diffraction method, and measuring the diffraction peak intensities derived from $Cu_2O$ and CuO. The particle size distribution can be obtained by using a laser diffraction method. The BET specific surface area can be obtained by measuring an amount of helium gas adsorbed.

[Paste Production Method]

The copper oxide paste can be kneaded by mixing the aforementioned binder resin and solvent, further adding copper particles, and using a mixing apparatus such as a planetary mixer. In order to improve dispersibility of the particles, a three-roll mill may be used if necessary.

The copper oxide paste according to the present embodiment is applied to, for example, a method for producing electronic parts, which will be described below, to form a copper sintered body between a chip component and a substrate, which can bond the chip component and the substrate firmly. Such a copper sintered body has high thermal conductivity, allowing thermal conduction from the chip component to the substrate, and thermal radiation.

The copper oxide paste according to the present embodiment has a high heat dissipation, a low electrical resistivity, and a high adhesion to the substrate. Therefore, the paste can be used for bonding chip components such as power devices and laser diodes to a substrate. Further, it can be used in any application as an alternative to conductive copper-based pastes.

2. Method for Producing Electronic Part

The method for producing an electronic part according to the present embodiment includes a step of applying or printing the aforementioned copper oxide paste on a surface of a substrate and a step of subjecting it to a heat treatment at a temperature of 200° C. or higher and 600° C. or lower in a reducing gas atmosphere to obtain a copper sintered body on the substrate.

As used herein, the "electronic part" designates, in addition to a form in which a chip component is arranged on a substrate, a product including a form including a wiring board in which conductive wiring is arranged on a so-called substrate.

[Paste Coating or Printing]

In the method for producing an electronic part according to the present embodiment, first of all, the copper oxide paste described above is applied or printed on a surface of a substrate.

A type and nature of the substrate are not particularly limited. For example, a metal substrate, an organic polymer substrate, a ceramic substrate, a carbon substrate, etc., can be used. Moreover, regarding the nature of the substrate, a substrate having heat dissipation property can be used.

As the metal substrate, a substrate made of a metal material such as copper, copper-molybdenum alloy, or aluminum can be used. As the organic polymer substrate, a substrate made of resin materials such as polyimide, a liquid crystal polymer, a fluororesin, polyethylene terephthalate, polyethylene naphthalate, a glass epoxy, etc., can be used. As the ceramic substrate, a substrate made of a ceramic material such as an inorganic oxide, an inorganic carbide, an inorganic nitride, or an inorganic oxynitride, can be used. For example, an inorganic material such as $SiO_2$, SiOCH, $SiN_x$, $Si_3N_4$, SiON, AlN, $Al_2O_3$, or silicon, can be used.

[Drying of Substrate]

In the method for producing electronic parts according to the present embodiment, the substrate, on which the copper oxide paste has been applied or printed, is preferably dried at a temperature of 60° C. or higher and 120° C. or lower, if necessary. This drying treatment is carried out in order to evaporate at least a portion of an organic solvent contained in the copper oxide paste. This makes it possible to suppress bumping of the organic solvent and to avoid damage to the copper sintered body in the subsequent heat treatment step.

The drying method is not particularly limited as long as the substrate, the surface of which the copper oxide paste is applied or printed, is maintained at a temperature of 60° C. or higher and 120° C. or lower. The method includes, for example, displacing the substrate on a hot plate or in a heating furnace, set at 60° C. or higher and 120° C. or lower.

A heating time in the drying step is not particularly limited. As to the lower limit, the heating time may be 2 minutes or longer, or 3 minutes or longer. As to the upper limit, the heating time, on the other hand, may be 1 hour or shorter, or 0.5 hours or shorter. Depending on the type of organic solvent used, for example, heating may be carried out at 60° C. for about 30 minutes or at 120° C. for about 5 minutes.

[Pressurization of Substrate]

In order to densely fill the copper-containing particles in the copper oxide paste to increase the thermal conductivity of the resultant copper sintered body and the bonding strength between a chip component and a substrate, the substrate is preferably pressed at a predetermined pressure, after the chip component is arranged on a surface of the dried paste. As the pressing direction, the laminating direction of the chip components, i.e., the direction perpendicular to the surface of the substrate, can be selected.

The applied pressure is preferably 2 MPa or more and 30 MPa or more. The pressure of less than 2 MPa does not allow the copper-containing particles to be sufficiently filled, and the thermal conductivity and the bonding strength of the obtained copper sintered body cannot be sufficiently enhanced. Meanwhile, an excessively-high pressure may damage the chip components. Therefore, the pressure is preferably 30 MPa or less.

The copper oxide paste according to the present embodiment can be applied to many applications as an alternative to the conventional conductive pastes. For example, it can be used to bond chip components such as a power device and laser diode to a substrate, or to form printed wiring. In a case of an application of bonding between a chip component and a substrate, the substrate, on which the copper oxide paste is applied or printed, is preferably dried and pressed, and then, is subjected to a predetermined heat treatment. In a case of an application to form printed wiring, the substrate need not necessarily to be pressed.

As the chip component, various chip components such as resistors, diodes, inductors, and capacitors can be used. For example, various semiconductor chips such as Si chips and SiC chips can be used. The chip component may be one used for a power device, a laser diode, etc.

The dimensions and shape of the chip component are not particularly limited. For example, a chip such as a square or a substantially square having a side length of 2 mm or longer and 20 mm or shorter, or a rectangle or a substantially rectangular shape having a short side length of 2 mm or longer and 20 mm or shorter, can be used.

[Heat Treatment for Substrate]

The method for producing an electronic part according to the present embodiment preferably includes, thereafter, subjecting the substrate to a heat treatment at a temperature of 200° C. or higher and 600° C. or lower in a reducing gas atmosphere to obtain a copper sintered body on the substrate. The heat treatment allows the organic solvent contained in the copper oxide paste to volatilize and the binder resin to react with oxygen of the copper oxide to be decomposed and removed. As a result, the copper oxide paste is sufficiently sintered, and the thermal conductivity and the bonding strength of the obtained copper sintered body can be enhanced.

The reducing gas atmosphere is not particularly limited. The reducing gas atmosphere is preferably one containing one or two or more gases selected from the group consisting of hydrogen, formic acid and an alcohol.

The reducing gas used in a state of a mixture with an inert gas facilitates safety. As the inert gas, a nitrogen gas, an argon gas, etc., can be used. A concentration of the reducing gas contained in the mixed gas is not particularly limited. From the viewpoint of sufficiently reducing $Cu_2O$ and CuO contained in the copper oxide paste, the concentration is preferably 0.5% by volume or higher, and may be 1% by volume or higher, or 2% by volume or higher.

A heating temperature of the heat treatment is preferably 200° C. or higher and 600° C. or lower. With a heating temperature of lower than 200° C., volatilization of the organic solvent contained in the paste and decomposition and removal of the binder resin do not proceed sufficiently. An excessively-high heating temperature may deteriorate the characteristics of the chip components. Therefore, the heating temperature is preferably 600° C. or lower.

A heating time of the heat treatment is not particularly limited. As to the lower limit value, the heating time is preferably 3 minutes or longer, or 5 minutes or longer. As to the upper limit value, the heating time is preferably 1 hour or shorter, or 0.5 hours or shorter. For example, heating conditions of about 1 hour at 220° C. or about 3 minutes at 600° C., can be selected.

The production method described above makes it possible to obtain a copper sintered body having an extremely low electrical resistivity and a high thermal conductivity. For example, the obtained copper sintered body characteristically has an electrical resistivity of 2.5 μΩcm or more and 12 μΩcm or less and a thermal conductivity of 55 $WK^{-1}m^{-1}$ or more and 250 $WK^{-1}m^{-1}$ or less.

EXAMPLES

Hereinafter, the present invention will be described in more detail with reference to Examples. The present invention is not limited to these Examples.

<Example 1> Effect of Particle Size Distribution

[Preparation of $Cu_2O$ Particles]

$Cu_2O$ particles were obtained by allowing a copper salt aqueous solution containing copper ions to react with an alkaline solution to precipitate copper hydroxide particles, and adding hydrazine hydrate, i.e., a reducing agent, and an ammonia aqueous solution, i.e., a pH adjuster, to the solution.

Moreover, another type of $Cu_2O$ particles was obtained by oxidizing electrolytic copper powder at a temperature of 180° C. in an oxidizing gas atmosphere and pulverizing it with a jet mill. By changing the oxygen concentration in the oxidizing gas, $Cu_2O$ particles having different shapes such as cubes or octahedra were obtained.

[Preparation of CuO Particles]

CuO particles were obtained by stirring the $Cu_2O$ particles obtained by the aforementioned method in hot water heated to 70° C. for 30 minutes. Further, another type of CuO particles was obtained by oxidizing electrolytic copper powder at a temperature of 300° C. in an oxidizing gas atmosphere and pulverizing it with a jet mill. By changing the oxygen concentration in the oxidizing gas, CuO particles having thin platy or fibrous shape, were obtained.

[Adjustment of Particle Size Distribution]

The particle size distributions of $Cu_2O$ particles and CuO particles were each adjusted by appropriately mixing particles which had been classified into 8 stages in a range of $D_{50}$ from 0.08 μm to 10 μm by mainly using a cyclone type centrifugal classification apparatus, an air separator type centrifugal classification apparatus, etc.

The particle size distribution of the copper-containing particles was measured by a laser diffraction/scattering type particle size distribution analysis method. Moreover, the BET specific surface area of the copper-containing particles was measured by a gas adsorption method for the copper-containing particles obtained by mixing CuO particles and $Cu_2O$ particles at a predetermined ratio.

[Production of Copper Oxide Paste]

An oxide paste for an evaluation test was obtained by weighing $Cu_2O$ particles to about 70% by mass, CuO particles to about 5% by mass, ethyl cellulose as the binder resin to 0.1% by mass, and terpineol as an organic solvent to 24.9% by mass, respectively, with respect to the total mass of the copper oxide paste, and subsequently kneading them with a planetary mixer. In the present Example 1, the copper oxide pastes of Examples 1-1 to 1-6 and the copper oxide pastes of Comparative Examples 1-1 to 1-4 were prepared as shown in Table 1.

[Production of Electronic Part Specimens]

Next, the method for producing the samples used in the evaluation test will be described. The obtained copper oxide paste was applied on a copper substrate by a screen printing method, and the coated substrate was dried on a hot plate heated to 100° C. in the air for 10 minutes. Next, a square SiC chip having a side length of 10 mm was placed on the dried copper oxide paste to produce a laminate in which the substrate, the copper oxide paste, and the SiC chip were stacked in this order. A Ni thin film having a thickness of about 0.5 μm was formed on the surface of the SiC chip, the surface being in contact with the copper oxide paste before the lamination.

Then, a pressure of 5 MPa was applied to both sides of the produced laminate, and then it was subjected to a heat treatment at 350° C. for 40 minutes in an atmosphere in which 3% by volume of hydrogen was mixed with nitrogen gas in a heating furnace to produce a sample having a copper sintered body. The resultant sample was subjected to the following evaluation tests such as a bonding strength and electrical resistivity.

[Evaluation of Bonding Strength]

By using a die shear apparatus, a shear stress was applied to the edge of the SiC chip and the die shear strength was measured. The shear test rate was 500 $\mu ms^{-1}$, and the shear height from the substrate was 100 μm. The die shear strength obtained by the measurement was rated to the following three-stage criteria A to C. Based on these criteria, the bonding strength of the copper sintered body was evaluated. In a case of the criterion being “A” or “B”, it was determined that the copper sintered body had a high bonding strength and the copper oxide paste provided a favorable bonding material.

A: 20 MPa or more

B: 10 MPa or more and less than 20 MPa

C: Less than 10 MPa

[Evaluation of Electrical Resistivity]

In the evaluation test of electrical resistivity, a sample for evaluation test was produced by using, instead of the SiC chip, a glass chip made of a glass plate of the same size as that of the SiC chip. This is due to the following reasons. In the case of a sample made of a SiC chip on which a Ni thin film is formed, the SiC chip is in a state of being bonded to the substrate by a copper sintered body. Accordingly, it is difficult to expose the copper sintered body and to measure electrical characteristics of the copper sintered body. In contrast, the glass chip is not bonded to the copper sintered body. Therefore, the glass chip can be easily removed after sintering, and thus, it is possible to expose the copper sintered body and to measure electrical characteristics of it.

In the similar manner as the sample having the SiC chip, a laminate having the copper sintered body was obtained by laminating a substrate, the copper oxide paste and a glass chip to obtain a sample, and subsequently subjecting the laminate to pressurization, a heat treatment and the like under the same conditions. After the heat treatment, the glass chip was removed to expose the surface of the copper sintered body. Then, four electrodes were arranged on the surface, and electrical resistivity of the copper sintered body was measured by a direct current four-probe method. The electrical resistivity obtained by the measurement was rated to the following three-stage criteria A to C. The numerical values in parentheses, additionally remarked of the criteria A to C above, are thermal conductivity, which was obtained from the electrical resistivity by converting it. In a case of the criterion being "A" or "B", it was determined that the copper sintered body had a low electrical resistivity and a high thermal conductivity and the copper oxide paste provided a favorable bonding material.

A: Less than 5.0 μΩcm (more than 134 $Wm^{-1}K^{-1}$)

B: 5.0 μΩcm or more and less than 9.0 μΩcm (more than 74 $Wm^{-1}K^{-1}$ and 134 $Wm^{-1}K^{-1}$ or less)

C: 9.0 μΩcm or more (74 $Wm^{-1}K^{-1}$ or less)

The electrical resistivity (ρ) can be converted into thermal conductivity (κ) by using the known Wiedemann-Franz equation shown in the following equation (3).

$$\kappa = LT/\rho \qquad (3)$$

L in the above equation (3) is a Lorenz constant. For copper, $L=2.23\times10^{-8}$ $W\Omega K^{-2}$. T is a temperature (K), a unit of ρ is Ωcm, and a unit of κ is $Wm^{-1}K^{-1}$. The numerical values of the thermal conductivity in the aforementioned criteria A to C indicate the values obtained by converting the electrical resistivity at T=300K by equation (3). Thus, the electrical resistivity (ρ) can be said to be an index that is inversely proportional to the thermal conductivity (κ). Therefore, in the present example, the thermal conductivity was also evaluated by using the measurement results of the electrical resistivity of the copper sintered body.

Table 1 shows the measurement results of the 50% cumulative particle size ($D_{50}$), the 50% cumulative particle size/10% cumulative particle size ($D_{50}/D_{10}$), the 90% cumulative particle size/50% cumulative particle size ($D_{90}/D_{50}$), and the BET specific surface area ($m^2/g$), of copper-containing particles, and the evaluation results of the bonding strength and the electrical resistivity.

In contrast, Comparative Example 1-1, Comparative Example 1-2, Comparative Example 1-3, and Comparative Example 1-4 each had any one or more of $D_{50}$, $D_{50}/D_{10}$, and $D_{90}/D_{50}$ that were particle size distributions of copper-containing particles, outside the scope of the present invention. Therefore, the copper sintered bodies produced by using these copper oxide pastes each had the bonding strength at a low level of the C criterion and was unsuitable as a bonding material. In addition, Comparative Example 1-4 exhibited the C criterion for the electrical resistivity and thermal conductivity.

<Example 2> Effect of BET Specific Surface Area

For Particles obtained by precipitation from a copper salt aqueous solution, a degree of aggregation of the primary precipitation particles can be adjusted by changing a type and concentration of a particle dispersant contained in the solution. Therefore, it is possible to obtain secondary particles having different surface unevenness, in which the primary particles are aggregated, and to provide particles having different BET specific surface areas. Further, the BET specific surface area can be adjusted by adjusting the degree of aggregation of the electrolytic copper particles in the same manner as described above to form secondary particles having different surface unevenness, and then carrying out an oxidation treatment. In contrast, for particles obtained by a high-pressure water atomization method, etc., each particle has a shape similar to a spherical shape. Therefore, a BET specific surface area, as a whole, can be adjusted by additionally adding and mixing actuate or platy CuO particles.

A copper oxide paste was produced by the same procedure as in Example 1, by weighing $Cu_2O$ particles to about

TABLE 1

| | Comparative Example 1-1 | Comparative Example 1-2 | Example 1-1 | Example 1-2 | Example 1-3 | Example 1-4 | Example 1-5 | Example 1-6 | Comparative Example 1-3 | Comparative Example 1-4 |
|---|---|---|---|---|---|---|---|---|---|---|
| $D_{50}$ (μm) | 0.08 | 0.14 | 0.20 | 0.23 | 0.32 | 0.92 | 2.82 | 4.88 | 6.20 | 9.18 |
| $D_{50}/D_{10}$ | 2.1 | 2.6 | 1.3 | 2.7 | 3.2 | 3.1 | 4.3 | 4.9 | 4.7 | 5.4 |
| $D_{90}/D_{50}$ | 1.1 | 1.1 | 3.1 | 1.2 | 1.8 | 2.7 | 3.1 | 3.7 | 4.3 | 4.2 |
| BET specific surface area ($m^2/g$) | 7.5 | 7.2 | 6.7 | 6.2 | 5.9 | 2.0 | 1.8 | 1.8 | 1.3 | 0.7 |
| Bonding strength | C | C | B | B | A | A | B | B | C | C |
| Electrical resistivity | A | A | A | A | A | A | A | B | B | C |

As shown in Table 1, the copper oxide pastes of Examples 1-1 to Examples 1-6 each had the 50% cumulative particle size ($D_{50}$), the 50% cumulative particle size/10% cumulative particle size ($D_{50}/D_{10}$), the 90% cumulative particle size/50% cumulative particle size ($D_{90}/D_{50}$), and the BET specific surface area ($m^2/g$), of the copper-containing particles contained in the copper oxide pastes, all within the scope of the present invention. Moreover, the copper sintered bodies produced by these copper oxide pastes each exhibited the characteristics satisfying the criterion of A or B for the bonding strength and the electrical resistivity. Therefore, the copper oxide pastes included in the scope of the present invention were confirmed to provide favorable bonding materials.

70% by mass, CuO particles to about 5% by mass, a resin to 0.1% by mass, and a solvent to 24.9% by mass, with respect to the total mass of the copper oxide paste, and kneading them with a planetary mixer to produce a copper oxide paste. In the present Example 2, the copper oxide pastes of Examples 2-1 to 2-8 and the copper oxide pastes of Comparative Examples 2-1 to 2-5 were produced. Thereafter, a sample for evaluation test was produced by the same procedure as in Example 1, and the die shear strength and electrical resistivity of the sample were measured.

Table 2 shows the measurement results of the particle size distribution and the BET specific surface area ($m^2/g$) of each of the copper-containing particles, and the evaluation results of the bonding strength and the electrical resistivity.

TABLE 2

| | Comparative Example 2-1 | Comparative Example 2-2 | Comparative Example 2-3 | Example 2-1 | Example 2-2 | Example 2-3 | Example 2-4 | Example 2-5 | Example 2-6 | Example 2-7 | Example 2-8 | Comparative Example 2-4 | Comparative Example 2-5 |
|---|---|---|---|---|---|---|---|---|---|---|---|---|---|
| $D_{50}$ (μm) | 4.6 | 2.1 | 1.2 | 1.1 | 1.2 | 0.71 | 0.65 | 0.52 | 0.44 | 0.28 | 0.23 | 0.23 | 0.13 |
| $D_{50}/D_{10}$ | 8.2 | 5.1 | 4.9 | 4.9 | 3.9 | 3.7 | 3.1 | 3.1 | 2.3 | 2.1 | 1.5 | 1.4 | 1.5 |
| $D_{90}/D_{50}$ | 1.8 | 1.8 | 2.1 | 2.7 | 2.8 | 3.1 | 3.7 | 3.7 | 3.2 | 3.5 | 3.7 | 4.1 | 5.3 |
| BET specific surface area ($m^2/g$) | 0.4 | 0.6 | 0.7 | 1.1 | 1.2 | 2.1 | 2.2 | 3.1 | 3.6 | 5.7 | 7.6 | 8.4 | 8.7 |
| Bonding strength | C | C | C | B | A | A | A | A | A | A | B | C | C |
| Electrical resistivity | B | B | B | A | A | A | A | A | A | A | B | B | B |

As shown in Table 2, the copper oxide pastes of Examples 2-1 to 2-8 each had the 50% cumulative particle size ($D_{50}$), the 50% cumulative particle size/10% cumulative particle size ($D_{50}/D_{10}$), the 90% cumulative particle size/50% cumulative particle size ($D_{90}/D_{50}$), and the BET specific surface area ($m^2/g$), of the copper-containing particles, all within the scope of the present invention. Then, the copper sintered bodies produced by these copper oxide pastes each exhibited the characteristics satisfying the criterion of A or B for the bonding strength and the electrical resistivity. Therefore, copper oxide pastes included within the scope of the present invention were confirmed to provide favorable bonding materials.

<Example 3> Effect of Molar Ratio of CuO/$Cu_2O$

A copper oxide paste was produced by the same procedure as in Example 1 except that the mixing ratio (molar ratio) between $Cu_2O$ particles and CuO particles was changed. In the present Example 3, the copper oxide pastes of Examples 3-1 to 3-3 and the copper oxide pastes of Comparative Examples 3-1 to 3-3 were produced. Thereafter, a sample for evaluation test was produced by the same procedure as in Example 1, and the die shear strength and electrical resistivity of the sample were measured.

Table 3 shows the measurement results of the particle size distribution and the BET specific surface area ($m^2/g$) of each of the copper-containing particles, and the evaluation results of the bonding strength and the electrical resistivity.

TABLE 3

| | Comparative Example 3-1 | Example 3-1 | Example 3-2 | Example 3-3 | Comparative Example 3-2 | Comparative Example 3-3 |
|---|---|---|---|---|---|---|
| $D_{50}$ (μm) | 0.58 | 0.62 | 0.57 | 0.64 | 0.61 | 0.72 |
| $D_{50}/D_{10}$ | 4.9 | 4.5 | 3.1 | 3.3 | 2.7 | 1.8 |
| $D_{90}/D_{50}$ | 2.8 | 3.1 | 2.9 | 1.9 | 3.2 | 2.3 |
| BET specific surface area ($m^2/g$) | 4.3 | 4.2 | 5.1 | 4.7 | 5.5 | 5.9 |
| Molar ratio of $Cu_2O$/CuO | (Not containing CuO) | 30 | 3 | 1 | 0.43 | 0.1 |
| Bonding strength | B | A | A | B | C | C |
| Electrical resistivity | C | A | A | A | B | C |

In contrast, Comparative Examples 2-1 to 2-5 each had the BET specific surface area of the copper-containing particles outside the scope of the present invention. Further, Comparative Example 2-1, Comparative Example 2-2, Comparative Example 2-4, and Comparative Example 2-5 each had any one or more of each index of "$D_{50}$", "$D_{50}/D_{10}$", and "$D_{90}/D_{50}$" that are related to the particle size distribution of the copper-containing particles outside the scope of the present invention. Therefore, the copper sintered bodies produced by these copper oxide pastes each had the bonding strength at a low level of the C criterion, and was unsuitable as a bonding material.

As shown in Table 3, the copper oxide pastes of Examples 3-1 to 3-3 each had the 50% cumulative particle size ($D_{50}$), the 50% cumulative particle size/10% cumulative particle size ($D_{50}/D_{10}$), the 90% cumulative particle size/50% cumulative particle size ($D_{90}/D_{50}$), and the BET specific surface area ($m^2/g$), of the copper-containing particles, all within the scope of the present invention. Further, these copper oxide pastes each had a mixing ratio (molar ratio) between the $Cu_2O$ particles and the CuO particles in the copper-containing particles of 1.0 or more. The copper sintered bodies produced by the copper oxide pastes each exhibited the characteristics satisfying the criterion of A or B for the bonding strength and the electrical resistivity, and was suitable as a bonding material.

Meanwhile, Comparative Examples 3-1 to 3-3 each had a mixing ratio (molar ratio) between the $Cu_2O$ particles and the CuO particles in the copper-containing particles of less than 1.0. The copper sintered bodies produced by these copper oxide pastes each had the bonding strength at a low level of the C criterion, and was unsuitable as a bonding material.

<Example 4> Effect of Proportion and Viscosity of Copper-Containing Particles in Copper Oxide Paste Copper-containing particles having $D_{50}$=0.32 μm, a particle size distribution of $D_{50}/D_{10}$=3.2, and $D_{90}/D_{50}$=2.4 as well as having a BET specific surface area of 3.5 $m^2/g$, were prepared by mixing the copper-containing particles classified in Example 1.

A copper oxide paste was produced by the same procedure as in Example 1 except that by using the copper-containing particles, the proportion of the copper-containing particles to the vehicle (the resin and organic solvent) was changed to the mass ratio of the copper-containing particles: the vehicle=x: 1−x. The above "x" is hereinafter referred to as "content of copper-containing particles". The vehicle used was prepared with a fixed ratio of (0.1:24.9), which corresponds to "the resin of 0.1% and the solvent of 24.9%" in Example 1. In the present Example 4, the copper oxide pastes of Examples 4-1 to 4-5 and the copper oxide pastes of Comparative Example 4-1 and Comparative Example 4-2 were produced. Thereafter, a sample for evaluation test was produced by the same procedure as in Example 1, and the die shear strength and electrical resistivity of the sample were measured.

Table 4 shows the evaluation results of the contents (% by mass) of copper-containing particles, bonding strengths, and electrical resistivity.

TABLE 4

| | Comparative Example 4-1 | Example 4-1 | Example 4-2 | Example 4-3 | Example 4-4 | Example 4-5 | Comparative Example 4-2 |
|---|---|---|---|---|---|---|---|
| Content of copper-containing particles (% by mass) | 50 | 60 | 70 | 80 | 90 | 92 | 95 |
| Bonding strength | C | B | A | A | B | B | C |
| Electrical resistivity | C | A | A | A | A | B | B |

The copper oxide pastes of Examples 4-1 to 4-5 each had the particle size distribution of the copper-containing particles and the BET specific surface area within the scope of the present invention. Further, as shown in Table 4, the content of the copper-containing particles with respect to the total amount of each copper oxide paste was within a range of 60 to 92% by mass. The copper sintered bodies produced by the copper oxide pastes each exhibited the characteristics satisfying the criterion of A or B for the bonding strength and the electrical resistivity, and was suitable as a bonding material.

In contrast, Comparative Example 4-1 and Comparative Example 4-2 each had a content of the copper-containing particles with respect to the total amount of each paste outside the range of 60 to 92% by mass. Therefore, the copper sintered bodies produced by these copper oxide pastes each had the bonding strength and the electrical resistivity at a low level of the C criterion, and was not suitable as a bonding material.

The invention claimed is:

1. A copper oxide paste used for bonding a chip component to a substrate, the copper oxide paste comprising copper-containing particles, a binder resin, and an organic solvent, wherein the copper-containing particles contain Cu2O particles having a cubic or octahedral shape and CuO particles having a fibrous or thin plate shape;

a total amount of copper constituting $Cu_2O$ and CuO in the copper-containing particles is 90% or more of a total copper amount of the copper-containing particles;

the copper-containing particles have a 50% cumulative particle size ($D_{50}$) of 0.20 μm or more and 5.0 μm or less, have a 10% cumulative particle size ($D_{10}$) satisfying the following formula (1) together with the 50% cumulative particle size ($D_{50}$), and have a 90% cumulative particle size ($D_{90}$) satisfying the following formula (2) together with the 50% cumulative particle size ($D_{50}$);

$$1.3 \le D_{50}/D_{10} \le 4.9 \quad (1)$$

$$1.2 \le D_{90}/D_{50} \le 3.7; \quad (2)$$

and the copper-containing particles have a BET specific surface area of 1.0 $m^2/g$ or more and 8.0 $m^2/g$ or less, wherein the copper-containing particles have a molar ratio of $Cu_2O$ to CuO of 1.0 or more, and wherein a content of the copper-containing particles is 60% by mass or more and 92% by mass or less with respect to a total amount of the copper oxide paste.

2. A method for producing an electronic part, comprising:

a step of applying the copper oxide paste according to claim 1 on a surface of a substrate by coating or printing; and a step of subjecting the substrate to a heat treatment at a temperature of 200° C. or higher and 600° C. or lower in a reducing gas atmosphere to obtain a copper sintered body on the substrate.

3. The method for producing an electronic part according to claim 2, wherein the substrate is a metal substrate, an organic polymer substrate, a ceramic substrate, or a carbon substrate.

4. The method for producing an electronic part according to claim 2, wherein the reducing gas atmosphere contains one or more gases selected from the group consisting of hydrogen, formic acid, and an alcohol.

5. The method for producing an electronic part according to claim 2, wherein the copper sintered body has an electrical resistivity of 2.5 μΩcm or more and 12 μΩcm or less.

6. The method for producing the electronic parts according to claim 2, further comprising, before the heat treatment, drying the applied copper oxide paste, and a step of placing a chip component on a surface of the dried copper oxide paste and applying a pressure of 2 MPa or more and 30 MPa or less in a direction from a surface of the chip component to the substrate.

* * * * *